(12) United States Patent
    Poulin

(10) Patent No.: US 11,683,016 B2
(45) Date of Patent: Jun. 20, 2023

(54) ISO-GAIN IMPLEMENTATION FOR A WIFI SYMBOL-POWER-TRACKING ARCHITECTURE

(71) Applicant: SKYWORKS SOLUTIONS, INC., Irvine, CA (US)

(72) Inventor: Grant Darcy Poulin, Carp (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 165 days.

(21) Appl. No.: 17/141,312

(22) Filed: Jan. 5, 2021

(65) Prior Publication Data

US 2021/0218374 A1    Jul. 15, 2021

Related U.S. Application Data

(60) Provisional application No. 62/958,901, filed on Jan. 9, 2020.

(51) Int. Cl.
    *H03F 1/42*       (2006.01)
    *H03F 3/24*       (2006.01)
    (Continued)

(52) U.S. Cl.
    CPC ............... *H03F 1/42* (2013.01); *H03F 3/245* (2013.01); *H03F 2200/36* (2013.01);
    (Continued)

(58) Field of Classification Search
    CPC .... H03F 1/0222; H03F 1/42; H03F 2200/451; H03F 2200/211; H03F 2200/36;
    (Continued)

(56) References Cited

U.S. PATENT DOCUMENTS

| | | | |
|---|---|---|---|
| 2008/0224769 A1* | 9/2008 | Markowski | H03F 3/217 330/136 |
| 2013/0024142 A1* | 1/2013 | Folkmann | H03F 3/189 702/62 |

(Continued)

OTHER PUBLICATIONS

Parvathy Venkatasubramanian and Jacek Ilow, "Opportunistic Configurations of Pilot Tones for PAPR Reduction in OFDM Systems", Opportunistic Configurations of Pilot Tones for PAPR Reduction in OFDM Systems, Dalhousie University, IEEE, 2017 (Year: 2017).*

(Continued)

*Primary Examiner* — Aristocratis Fotakis
(74) *Attorney, Agent, or Firm* — Lando & Anastasi, LLP

(57) ABSTRACT

A power amplifier module including an input configured to receive an input radio frequency signal, the input radio-frequency signal including a series of data symbols, an output configured to provide an output radio-frequency signal, a power amplifier having a signal input to receive the input radio-frequency signal and a power supply input to receive a supply voltage, the power amplifier configured to amplify the input radio-frequency signal to provide the output radio-frequency signal, and a controller to receive an indication of a peak output power level of an upcoming data symbol in the series of data symbols, to adjust at least the supply voltage provided to the power amplifier based on the peak output power level of the upcoming data symbol, and to configure the power amplifier module to maintain a substantially constant gain over the series of data symbols.

20 Claims, 10 Drawing Sheets

(51) Int. Cl.
*H04L 5/00* (2006.01)
*H04W 84/12* (2009.01)

(52) U.S. Cl.
CPC ...... *H03F 2200/451* (2013.01); *H04L 5/0007* (2013.01); *H04W 84/12* (2013.01)

(58) Field of Classification Search
CPC . H04L 27/2601; H04L 5/0007; H03G 3/3042; H04W 84/12
See application file for complete search history.

(56) References Cited

U.S. PATENT DOCUMENTS

| | | | | |
|---|---|---|---|---|
| 2013/0279629 | A1* | 10/2013 | Seller | H03F 3/24 375/295 |
| 2015/0126141 | A1* | 5/2015 | Arno | H03F 1/3241 455/114.3 |
| 2016/0080013 | A1* | 3/2016 | Arno | H04B 1/0475 455/114.3 |
| 2017/0230022 | A1* | 8/2017 | Lee | H04B 1/40 |
| 2019/0319583 | A1* | 10/2019 | El-Hassan | H03F 3/245 |
| 2021/0126587 | A1* | 4/2021 | Panseri | H03F 1/223 |

OTHER PUBLICATIONS

Paek et al., "15.2, A 90ns/V Fast-Transition Symbol-Power-Tracking Buck Converter for 5G mm-Wave Phased-Array Transceiver", ISSCC 2019, Session 15, Power for 5G, Wireless Power, and GAN Converters, 2019 IEEE International Solid-State Circuits Conference, Jun. 2019.

Paek et al., "WSK-4: High-Efficiency RF-PA Supply Modulation Techniques for mm-Wave Amplifiers", Samsung Electronics, Jun. 2, 2019.

* cited by examiner

ISO-GAIN IMPLEMENTATION FOR A WIFI SYMBOL-POWER-TRACKING ARCHITECTURE

CROSS-REFERENCE TO RELATED APPLICATIONS

This application claims priority under 35 U.S.C. § 119(e) to U.S. Provisional Patent Application Ser. No. 62/958,901, titled ISO-GAIN IMPLEMENTATION FOR A WIFI SYMBOL-POWER-TRACKING ARCHITECTURE, filed Jan. 9, 2020, which is incorporated herein by reference for all purposes.

BACKGROUND

Wireless communication devices commonly use communication protocols, such as WiFi, that utilize orthogonal frequency-division multiplexing (OFDM) to achieve high data throughput. In many cases, OFDM corresponds to a high peak-to-average power ratio, leading to relatively inefficient power amplifiers. As a result, such wireless communication devices may operate with increased power consumption. In some cases, Envelope Tracking (ET) can be used to improve power amplifier efficiency; however, due to bandwidth limitations, ET is often not practical for use in WiFi systems.

SUMMARY

At least one aspect of the present disclosure is directed to a power amplifier module including an input configured to receive an input radio-frequency signal, the input radio-frequency signal including a series of data symbols, an output configured to provide an output radio-frequency signal, a power amplifier having a signal input to receive the input radio-frequency signal and a power supply input to receive a supply voltage, the power amplifier configured to amplify the input radio-frequency signal to provide the output radio-frequency signal, and a controller to receive an indication of a peak output power level of an upcoming data symbol in the series of data symbols, to adjust at least the supply voltage provided to the power amplifier based on the peak output power level of the upcoming data symbol, and to configure the power amplifier module to maintain a substantially constant gain over the series of data symbols.

In one embodiment, the controller is configured to adjust the supply voltage provided to the power amplifier by setting the supply voltage to a minimum supply voltage needed to achieve the peak output power level of the upcoming data symbol. In some embodiments, the controller is configured to adjust the supply voltage provided to the power amplifier by controlling power supply circuitry coupled to the power amplifier. In various embodiments, the controller is configured to receive the indication of the peak output power level of the upcoming data symbol from a baseband processor configured to generate the series of data symbols. In certain embodiments, the controller includes a memory device configured to store a look-up table used to adjust the supply voltage provided to the power amplifier.

In some embodiments, configuring the power amplifier module to maintain a substantially constant gain includes adjusting a bias current provided to the power amplifier. In one embodiment, the controller is configured to adjust the bias current provided to the power amplifier by controlling bias circuitry coupled to the power amplifier. In various embodiments, the controller is configured to adjust the bias current provided to the power amplifier by adjusting a reference current provided by the controller. In certain embodiments, the bias current is adjusted such that a gain of the power amplifier varies by less than 0.05 dB over the series of data symbols.

In various embodiments, configuring the power amplifier module to maintain a substantially constant gain includes adjusting an amplitude of the input radio-frequency signal provided to the power amplifier. In some embodiments, the power amplifier module includes an adjustable attenuator coupled to the input, the controller being configured to control the adjustable attenuator to adjust the amplitude of the input radio-frequency signal provided to the power amplifier. In one embodiment, the power amplifier module is configured to maintain a substantially constant gain over the series of data symbols such that the output radio-frequency signal is provided with a desired Error Vector Magnitude (EVM). In certain embodiments, the power amplifier module is included in a WiFi system using an orthogonal frequency-division multiplexing (OFDM) scheme and the series of data symbols of the input radio-frequency signal correspond to at least one WiFi burst.

Another aspect of the present disclosure is directed to a method of operating a power amplifier module. The method includes receiving an input radio-frequency signal at an input of a power amplifier, the input radio-frequency signal including a series of data symbols, receiving an indication of a peak output power level of an upcoming data symbol in the series of data symbols, amplifying the input radio-frequency signal to provide an output radio-frequency signal at an output of the power amplifier, adjusting at least a supply voltage provided to the power amplifier based on the peak output power level of the upcoming data symbol, and configuring the power amplifier module to maintain a substantially constant gain over the series of data symbols.

In one embodiment, adjusting the supply voltage provided to the power amplifier based on the peak output power level of the upcoming data symbol includes setting the supply voltage to a minimum supply voltage needed to achieve the peak output power level of the upcoming data symbol. In some embodiments, configuring the power amplifier module to maintain a substantially constant gain includes adjusting a bias current provided to the power amplifier. In various embodiments, configuring the power amplifier module to maintain a substantially constant gain includes adjusting an amplitude of the input radio-frequency signal provided to the power amplifier. In certain embodiments, adjusting the amplitude of the input radio-frequency signal provided to the power amplifier includes controlling an adjustable attenuator coupled to the input of the power amplifier.

In some embodiments, the indication of the peak output power level of the upcoming data symbol in the series of data is provided by a baseband processor configured to generate the series of data symbols. In one embodiment, the power amplifier module is included in a WiFi system using an orthogonal frequency-division multiplexing (OFDM) scheme and the series of data symbols of the input radio-frequency signal correspond to at least one WiFi burst.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and examples are directed to amplifier systems and components thereof, and to devices, modules, and systems incorporating same.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
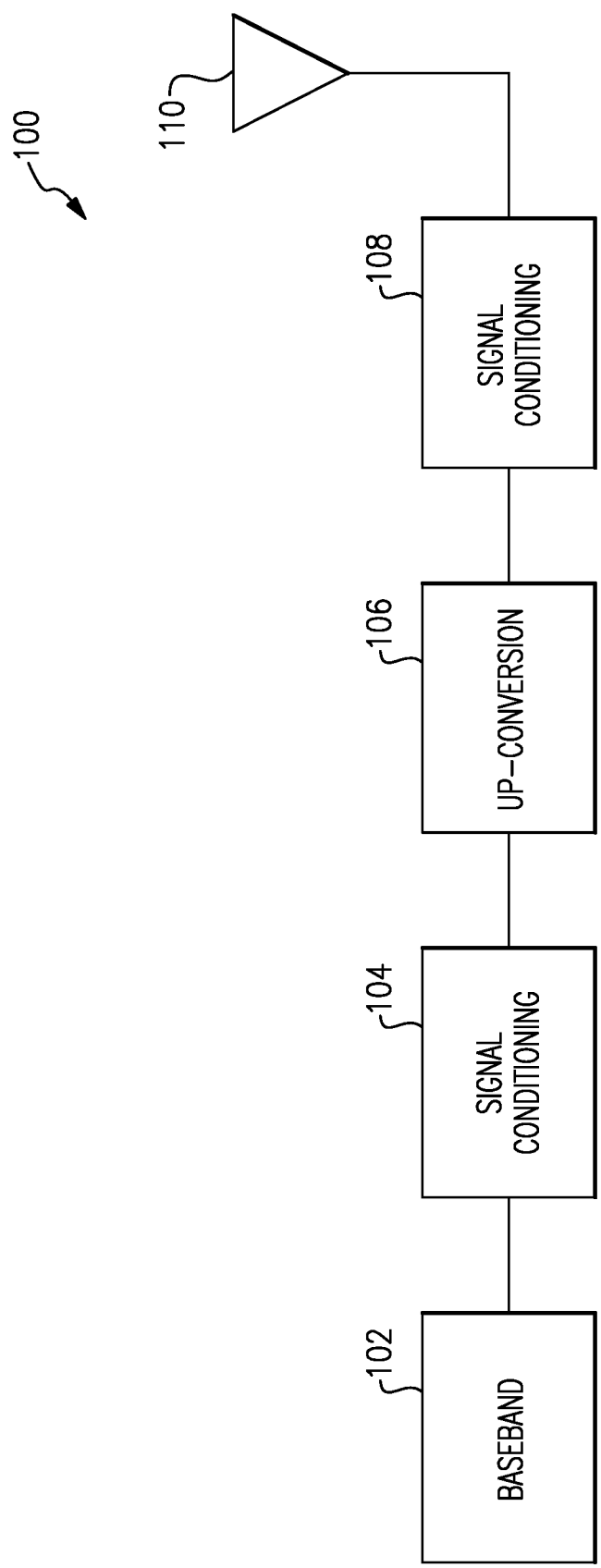
FIG. 1 is a block diagram of an example wireless transmission chain.

FIG. 1 is a block diagram of an example of a wireless transmit (TX) chain 100. The wireless TX chain 100 may be included, for example, in a wireless device such as a cellular phone or a laptop computer. The TX chain 100 includes a baseband processor 102 configured to provide transmit baseband signals that are conditioned and upconverted to a desired transmit frequency. The TX chain 100 may include a signal conditioning stage 104 before the up-conversion stage 106 and a signal conditioning stage 108 after the up-conversion stage 106; however, in some examples the TX chain 100 may only include one signal conditioning stage (i.e., 104 or 108). In some examples, the TX chain 100 may include more than one up-conversion stage. After conditioning and up-conversion, the transmit signals are transmitted via an antenna 110.

The signal conditioning stages 104, 108 often include power amplifiers to provide amplification of the transmit signal to meet the performance requirements of various wireless standards (e.g., WiFi). For use in WiFi systems, such power amplifiers must be operated with a very stable gain over a wide range of power levels to keep EVM as low as possible (e.g., −45 dB).

As discussed above, many WiFi systems utilize orthogonal frequency-division multiplexing (OFDM) schemes to transmit and receive signals having high data rates. Such high data rates can be achieved by transmitting data symbols using parallel subcarriers.

Figure 2A:
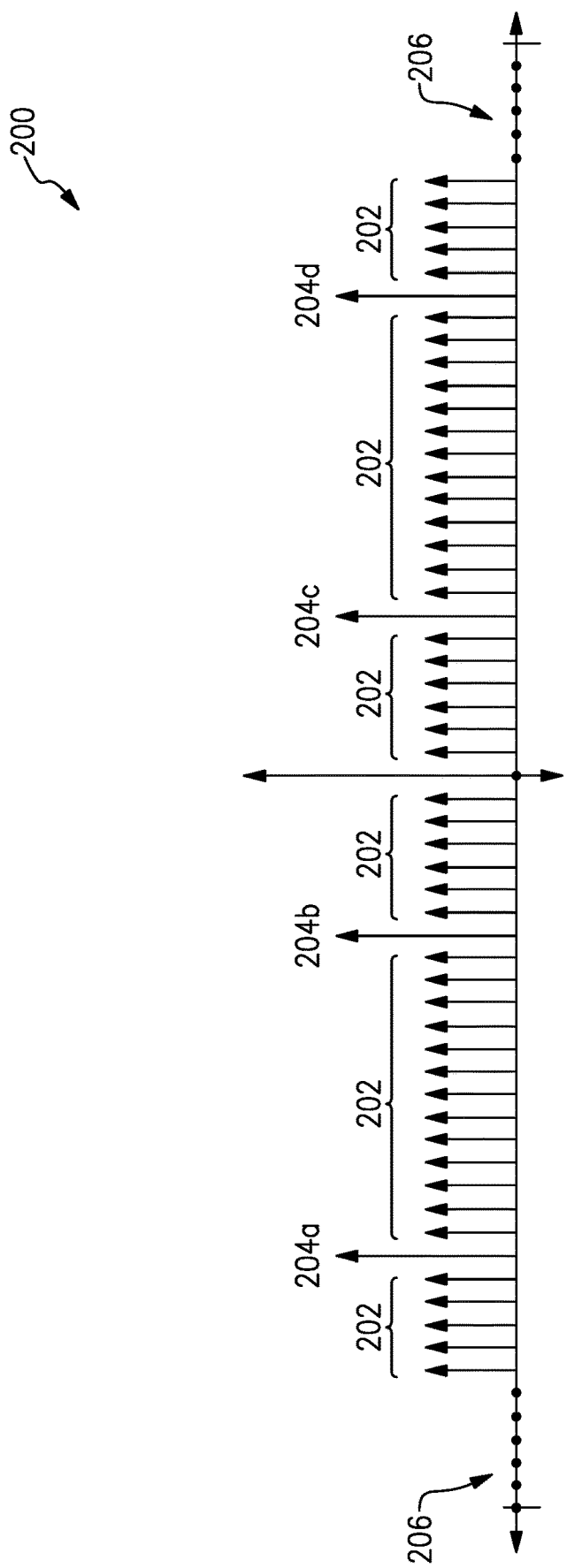
FIG. 2A is a diagram of an example wireless signal in the frequency domain.

FIG. 2A is a diagram of a typical OFDM signal 200 used in WiFi systems (shown in the frequency domain). In one example, the signal 200 includes fifty-two subcarriers which occupy a channel bandwidth (e.g., 20 MHz). Each of the fifty-two subcarriers may be separated in frequency by a fixed amount (e.g., 312.5 kHz). In some examples, each of the fifty-two subcarriers may be assigned as either a data subcarrier 202 or a pilot tone 204. For example, as shown in FIG. 2A, the signal 200 may include forty-eight data subcarriers and four pilot tones. The pilot tones 204 are placed between the data subcarriers 202 and may be used for frequency offset correction. In most instances, the pilot tones 204 have a fixed amplitude. In addition, the signal 200 may include frequency guard bands 206 to improve isolation between adjacent channels.

In some examples, the data subcarriers 202 may correspond to a data symbol (e.g., a bitstream). For example, each data subcarrier 202 may be modulated using a modulation scheme, e.g., PSK, QAM, etc., and the aggregate sum of the data subcarriers 202 may represent the symbol. In one example, the data subcarriers 202 may be updated to represent a new symbol at a fixed interval (e.g., every 4 us). The length of the fixed interval at which the data subcarriers 202 are updated (i.e., 4 us) may be referred to as the symbol length. In some examples, the channel bandwidth, number of data subcarriers, modulation scheme, and other parameters of the signal 200 may correspond to the WiFi protocol (802.11g, 802.11ac, etc.).

Figure 2B:
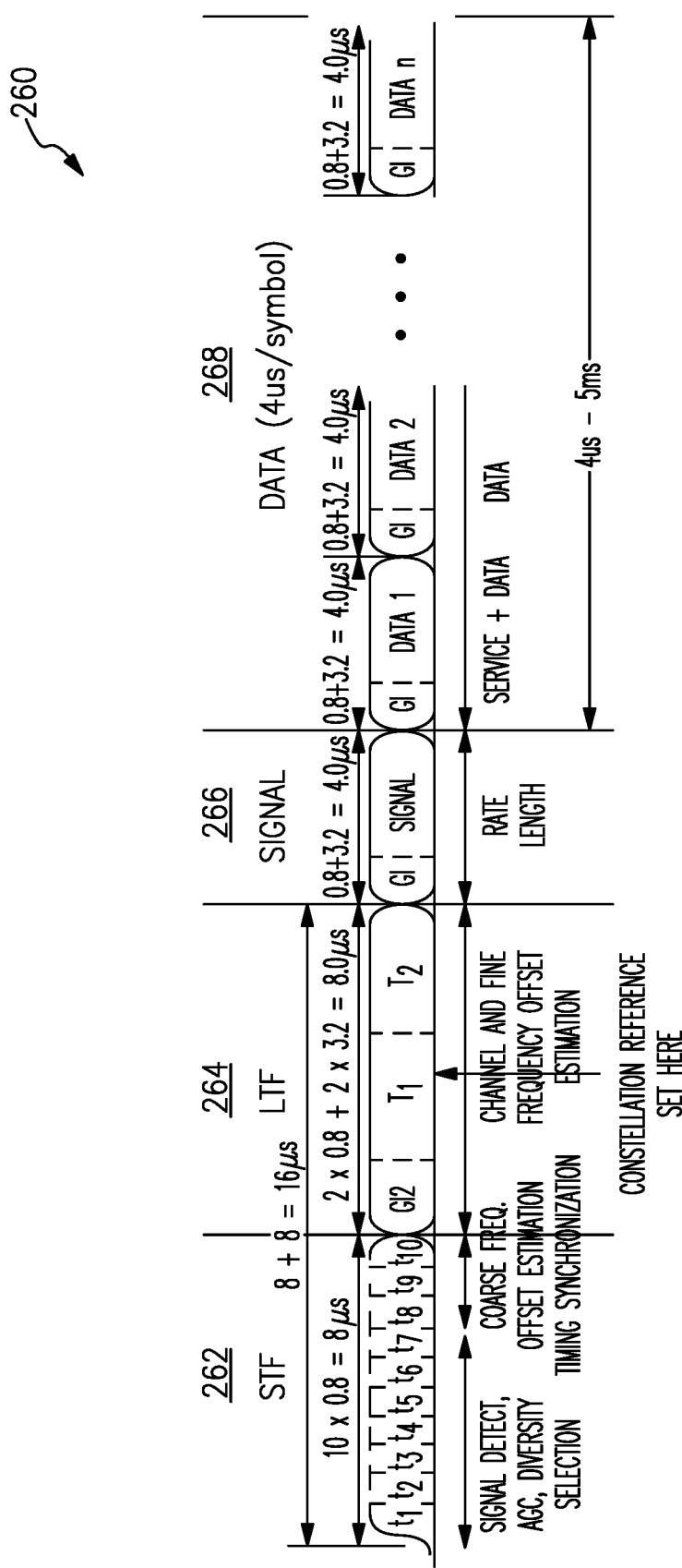
FIG. 2B is a diagram of an example burst structure of a wireless signal.

In many WiFi systems, symbols may be transmitted in a burst structure. FIG. 2B illustrates a diagram of a typical burst structure 260 used in WiFi systems. In one example, the burst structure 260 includes a short training field (STF) 262, a long training field (LTF) 264, a signal field 266, and a data field 268. The STF 262 may be used by a receiver to detect the start of the burst and to set automatic gain control settings (AGC). The LTF 264 may be used by the receiver to set constellation reference points corresponding to the modulation scheme used to modulate the subcarriers included in the data field 268 (e.g., data subcarriers 202). In some examples, the constellation reference points may be used for all subsequent EVM calculations associated with the burst. The signal field 266 is used to communicate the data rate and the length of the burst (i.e., the length of the data field 268) to the receiver. The data field 268 includes the data signal (e.g., signal 200) configured to transmit one or more symbols. The length of the data field 268 may correspond to the number of symbols to be transmitted and the symbol length (e.g., 4 us). For example, the length of the data field 268 for one symbol may be 4 us, two symbols 8us, three symbols 12 us, and so on. Being that the constellation reference points are set using the LTF 264 (i.e., before the data field 268), the overall transmit gain may be substantially constant (e.g., within 0.05 dB) over the duration of the burst in order for the receiver to recover the transmitted data using the constellation reference points.

Figure 3A:
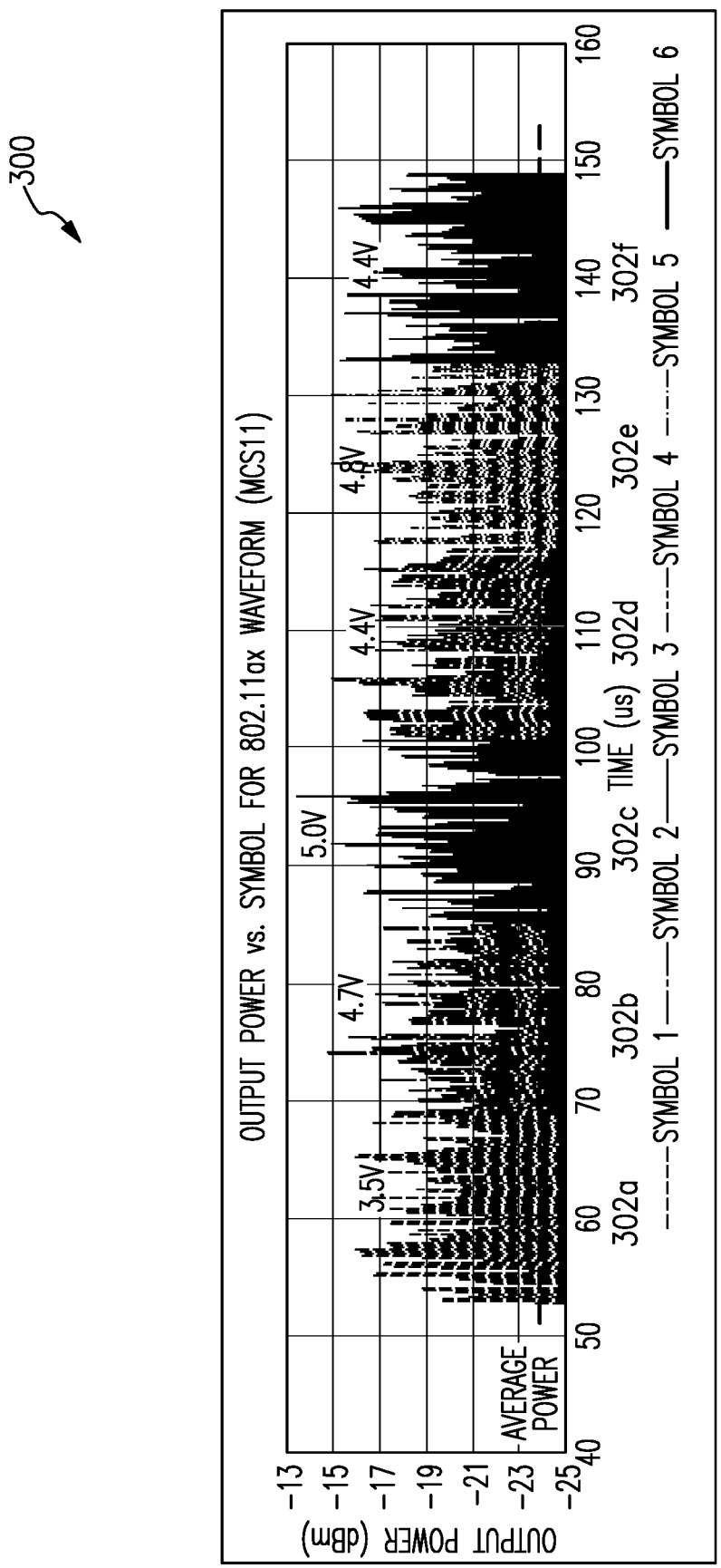
FIG. 3A is a diagram of an example wireless signal in the time domain.

In some examples, a key disadvantage of OFDM is a high peak-to-average power ratio, leading to relatively inefficient power amplifiers. FIG. 3A illustrates a diagram of a signal 300 including six symbols 302a-302f (shown in the time domain). In one example, the portion of the signal 300 between ~53-69 us corresponds to the first symbol 302a, the portion of the signal 300 between ~69-85 us corresponds to the second symbol 302b, the portion of the signal 300 between ~85-101 us corresponds to the third symbol 302c, the portion of the signal 300 between ~101-117 us corresponds to the fourth symbol 302d, the portion of the signal 300 between ~117-133 us corresponds to the fifth symbol 303e, and the portion of the signal 300 between ~133-149 us corresponds to the sixth symbol 302f. In some examples, the symbols 302a-302f may be the first six symbols transmitted in a burst including a plurality of symbols (e.g., a burst including 250 symbols). As shown, the average power of each symbol may remain substantially constant across the burst (e.g., −24 dBm); however, the peak voltage of each symbol may vary. For example, the peak voltage of the first symbol 302a may be a first value (e.g., 3.5V), the peak voltage of the second symbol 302b may be a second value (e.g., 4.7V), and so on. In some examples, since the peak voltage varies symbol-to-symbol, the peak power of each symbol may also vary. It should be appreciated that the characteristics of the symbols 302a-302f (e.g., length, peak voltage, etc.) are merely shown in FIG. 3A for demonstrative purposes.

Figure 3B:
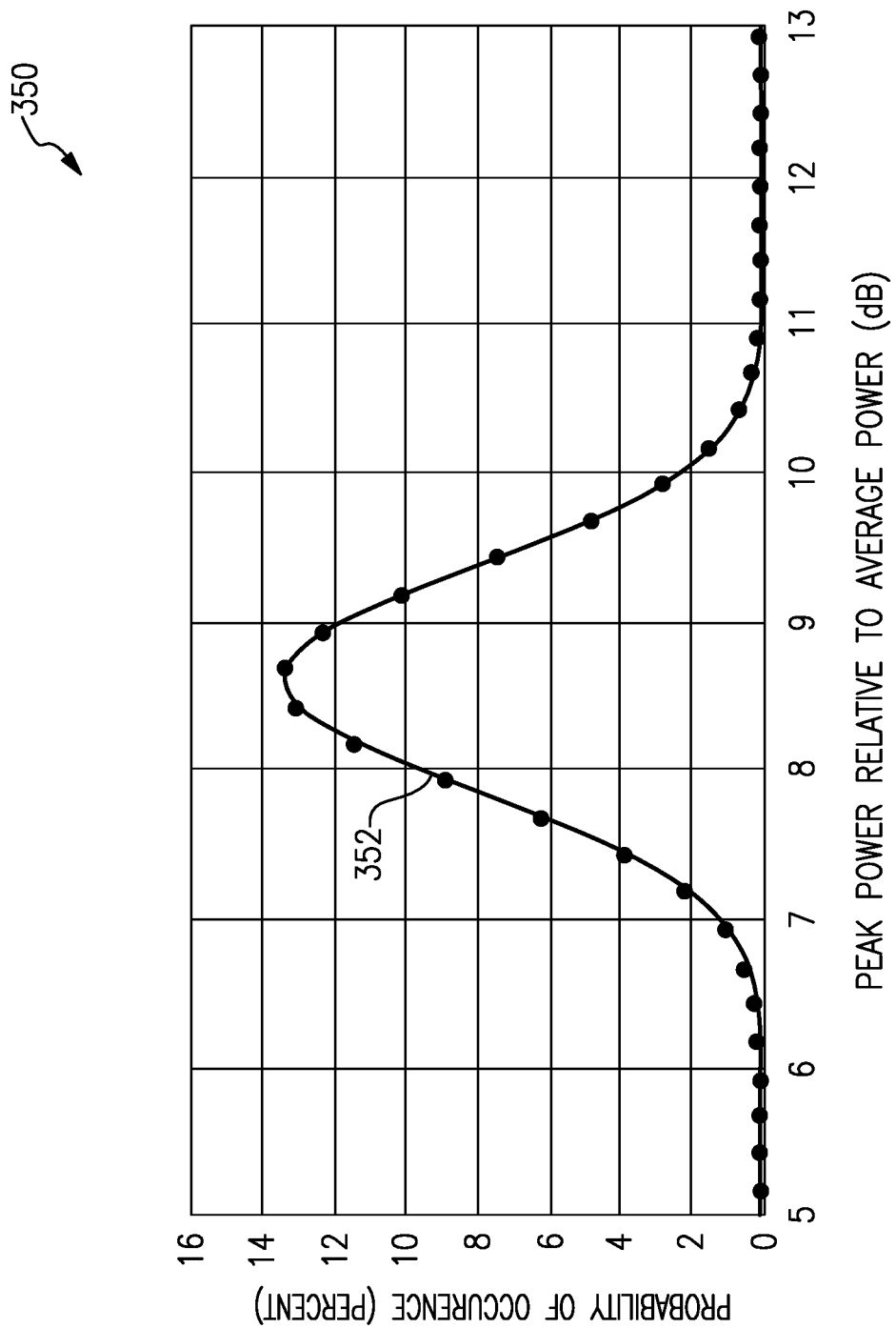
FIG. 3B is a graph illustrating an example peak power range of a wireless OFDM signal.
Figure 3C:
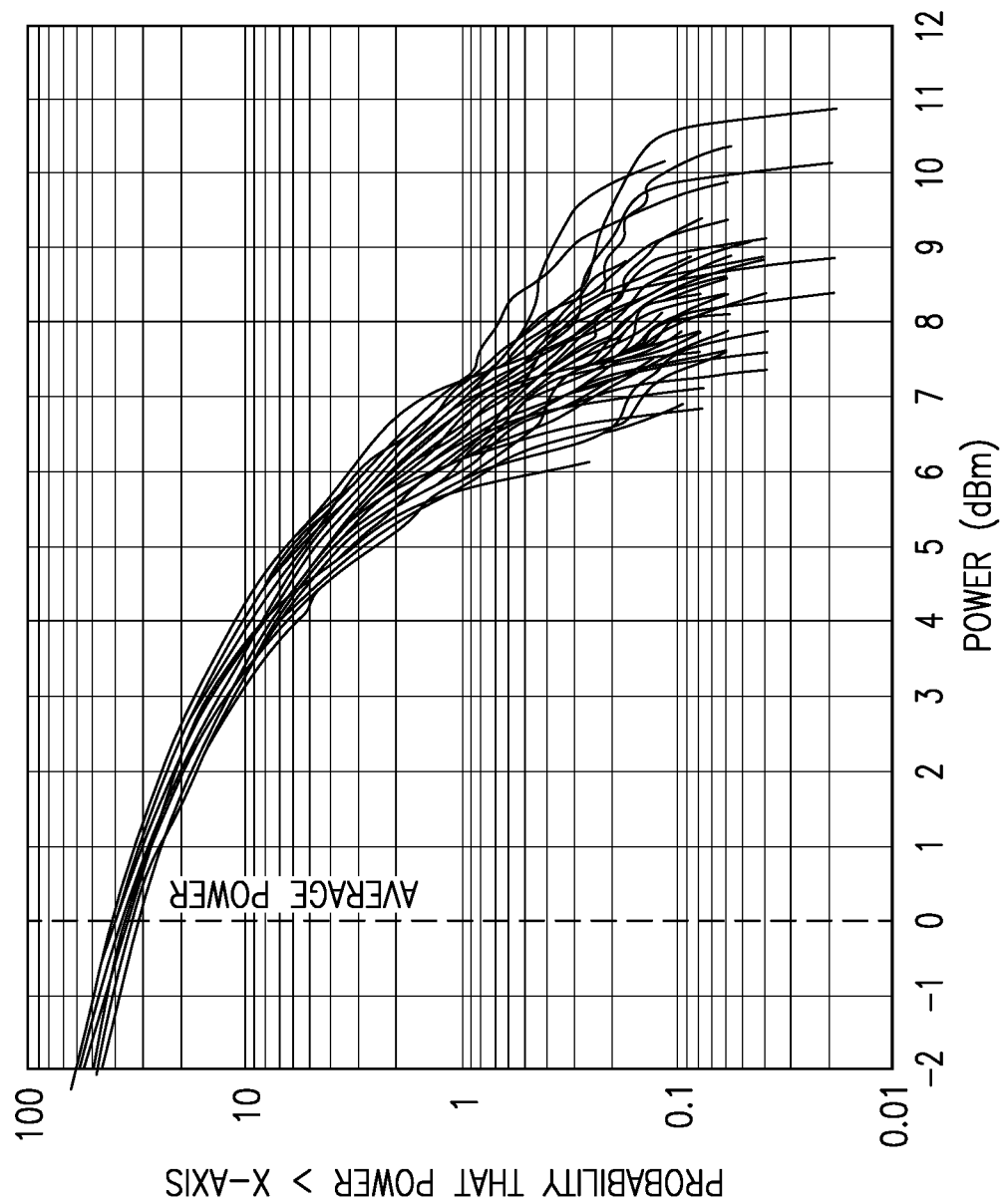
FIG. 3C is a graph illustrating an example of Complementary Cumulative Distribution Functions (CCDF) for an 802.11ax wireless OFDM signal.

FIG. 3B illustrates a graph 350 showing the peak power range (i.e., the peak power probability distribution) of a wireless OFDM burst including 250 symbols. In one example, a Complementary Cumulative Distribution Function (CCDF) may be measured for each symbol of the burst to determine the peak power of each symbol (as shown in FIG. 3C). In the graph 350, a curve 352 represents the distribution of the symbol peaks as measured from the CCDFs, relative to the average power of the burst, measured over all of the symbols in the burst. In one example, the maximum point of the curve 352 may correspond to the most common peak symbol power value during the burst. For example, the most common peak symbol power values may be 8-9 dB higher than the average power of the burst. The peak power varies from burst to burst, and the curve 352 shows that the peak power range of the burst may be 6-11 dB higher than average power of the burst.

In some examples, due to the high peak-to-average power ratios associated with OFDM, WiFi power amplifiers (e.g., included in signal conditioning stages 104, 108) may operate with reduced efficiency. For example, a typical WiFi power amplifier may achieve efficiencies of less than 20%, meaning that the power amplifier consumes more than 2.5 W of DC power to deliver 500 mW of RF power.

Several techniques have been proposed to improve the efficiency of OFDM power amplifiers. One commonly used technique is Envelope Tracking (ET), where the supply voltage of the power amplifier is varied continuously with the envelope of the OFDM signal. This allows the power amplifier's efficiency to be increased. However, envelope tracking is not practical for wide bandwidth signals. For example, the maximum bandwidth that ET can achieve is well under 100 MHz. Since WiFi uses bandwidths of 160 MHz (e.g., WiFi 6) or 320 MHz (e.g., WiFi 7), ET may not be practical for use in modern WiFi systems.

Another high efficiency technique is called Symbol Power Tracking (SPT). SPT adjusts the power amplifier supply voltage on a symbol by symbol basis. As such, the supply modulation occurs at a much slower rate than it does for ET. In some cases, SPT may be practical for WiFi power amplifiers. However, WiFi systems have several unique requirements not seen in cellular systems: the power amplifier output signal needs to be constant versus time for the duration of the burst in order to maintain high linearity, as measured by very low Error Vector Magnitude (EVM). In addition, the EVM and linearity requirements of OFDM are much more stringent than those seen in cellular systems, being that WiFi uses higher order modulation to increase data rates. For example, some WiFi systems use 1024QAM, requiring an EVM smaller than −45 dB, whereas many cellular systems use 64QAM, with greatly relaxed EVM requirements, as EVM is typically only −30 dB.

In most cases, when the supply voltage applied to a power amplifier is changed, the gain of the power amplifier will also change. In some examples, the reference signal used to derive the target constellation points for EVM calculations are placed at the very beginning of the WiFi burst. The EVM of each symbol is referred back to these reference points. As such, if the gain of the power amplifier changes during the burst, even if the power amplifier is perfectly linear, this will be interpreted as an EVM degradation. The gain of the power amplifier therefore needs to remain constant over the entire duration of the burst. The combination of high linearity and flat gain versus time for WiFi power amplifiers creates a unique requirement when SPT is applied to WiFi power amplifiers.

As discussed above, power amplifiers used in WiFi systems must have a very stable gain (i.e., iso-gain) over the duration of the burst to keep EVM as low as possible. In order to support the full signal amplitude range while maintaining acceptable EVM performance, such power amplifiers are often operated with a constant supply voltage corresponding to the highest peak symbol power. In many cases, operating the power amplifier with a constant supply voltage can reduce the efficiency of the amplifier, as the amplifier consumes an excess amount of power when amplifying any symbol other than the symbol(s) corresponding to the highest peak symbol power.

Systems and methods directed to a power amplifier configured to receive a modulated supply voltage are provided herein. More specifically, the supply voltage is modulated in accordance with the peak power of each symbol being amplified. In at least one embodiment, the supply voltage is modulated to reduce excess power consumption of the power amplifier while maintaining a substantially constant gain.

Figure 4A:
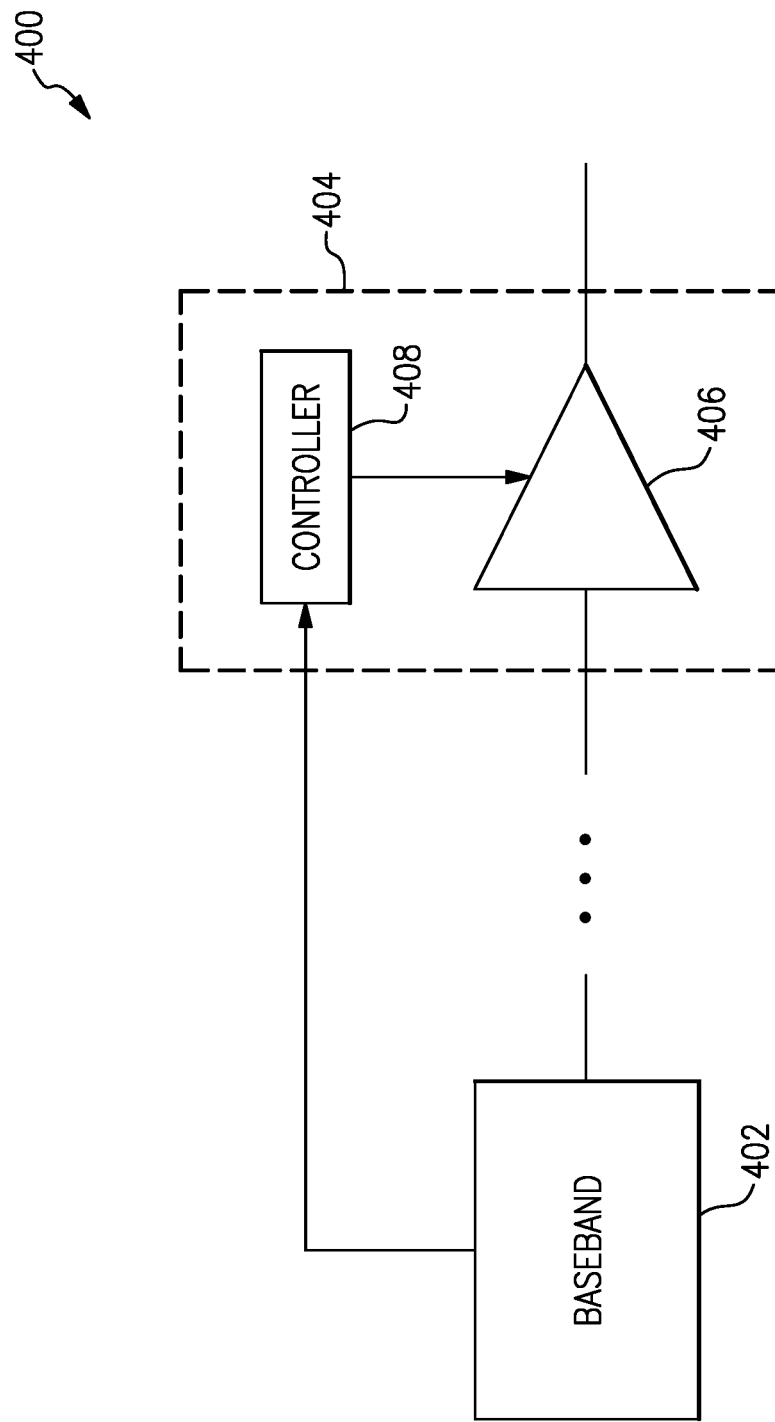
FIG. 4A is a schematic diagram of a power amplifier arrangement in accordance with one embodiment.

FIG. 4A illustrates one embodiment of a power amplifier arrangement 400 in accordance with aspects described herein. The power amplifier arrangement 400 includes a power amplifier 404 configured to receive a transmit signal from a baseband processor 402. The power amplifier 404 may be included, for example, in either of the signal conditioning stages 104 and 108 shown in FIG. 1. As such, in some examples, there may be additional components and/or circuitry coupled between the baseband processor 402 and the power amplifier 404 (e.g., the up-conversion stage 106 shown in FIG. 1). Likewise, the baseband processor 402 may be, for example, the baseband processor 102 shown in FIG. 1.

In one example, the baseband processor 402 is configured to generate a transmit signal for use in WiFi systems as described above. For example, the transmit signal may be one or more OFDM signals (e.g., signal 200 of FIG. 2A) included in the burst structure 260 of FIG. 2B. The power amplifier 404 includes a signal input to receive the transmit signal provided by the baseband processor 402. In one example, the power amplifier 404 may include one or more amplifier gain stages 406. As discussed above, the one or more gain stages may be biased to provide a substantially constant gain to amplify the transmit signal. A signal output of the power amplifier 404 may be configured to provide the amplified transmit signal to another component (e.g., the up-conversion stage 106, antenna 110, etc.).

In certain embodiments, a controller 408 is included in the power amplifier 404. In one example, the controller 408 is a programmable digital controller. In some examples, the controller 408 may include one or more memory devices, such as flash, embedded or on-chip memory, or other devices for storing data. In one embodiment, the controller 408 is coupled to the one or more amplifier gain stages 406 and configured to communicate with the baseband processor 402. In some embodiments, the controller 408 may also be coupled to bias and/or power supply circuitry (not shown).

As described above, the transmit signal includes a plurality of symbols, and the peak power of the transmit signal may vary between symbols. In one example, the baseband processor 402 may have a look-up table stored in memory. The look-up table may include the peak power of each symbol. As such, the baseband processor 402 may be configured to send an indication of the peak power of the upcoming symbol to the controller 408. In one example, the controller 408 may receive an indication of the peak power for the upcoming symbol from the baseband processor 402. The controller 408 may use the received indication from the baseband processor 402 to determine the minimum supply voltage needed to achieve the peak output power of the upcoming symbol. In one example, the controller 408 may include a look-up table relating peak output power to supply voltage. For example, symbols having higher peak voltages may require a higher supply voltage than symbols with lower peak voltages. As such, the controller 408 may adjust the supply voltage provided to the power amplifier 404 accordingly (e.g., by controlling power supply circuitry). In other examples, the look-up table stored in the baseband processor 402 may also include the minimum supply voltage of the power amplifier 404 needed to achieve the peak output power of each symbol, and the baseband processor 402 may send the supply voltage value corresponding to the upcoming symbol to the controller 408 of the power amplifier 404. By dynamically modulating the supply voltage based on peak symbol power, excess power consumed by the power amplifier 404 can be reduced.

In some examples, adjusting the supply voltage provided to the power amplifier 404 may alter the gain of the amplifier slightly. In one example, the baseband processor 402 may adjust the amplitude of the transmit signal to compensate for any minor gain variations; i.e., gain variations not significant enough to impact EVM performance. In other examples, the amplitude of the transmit signal may be adjusted using circuitry coupled between the baseband processor 402 and the power amplifier 404.

Figure 4B:
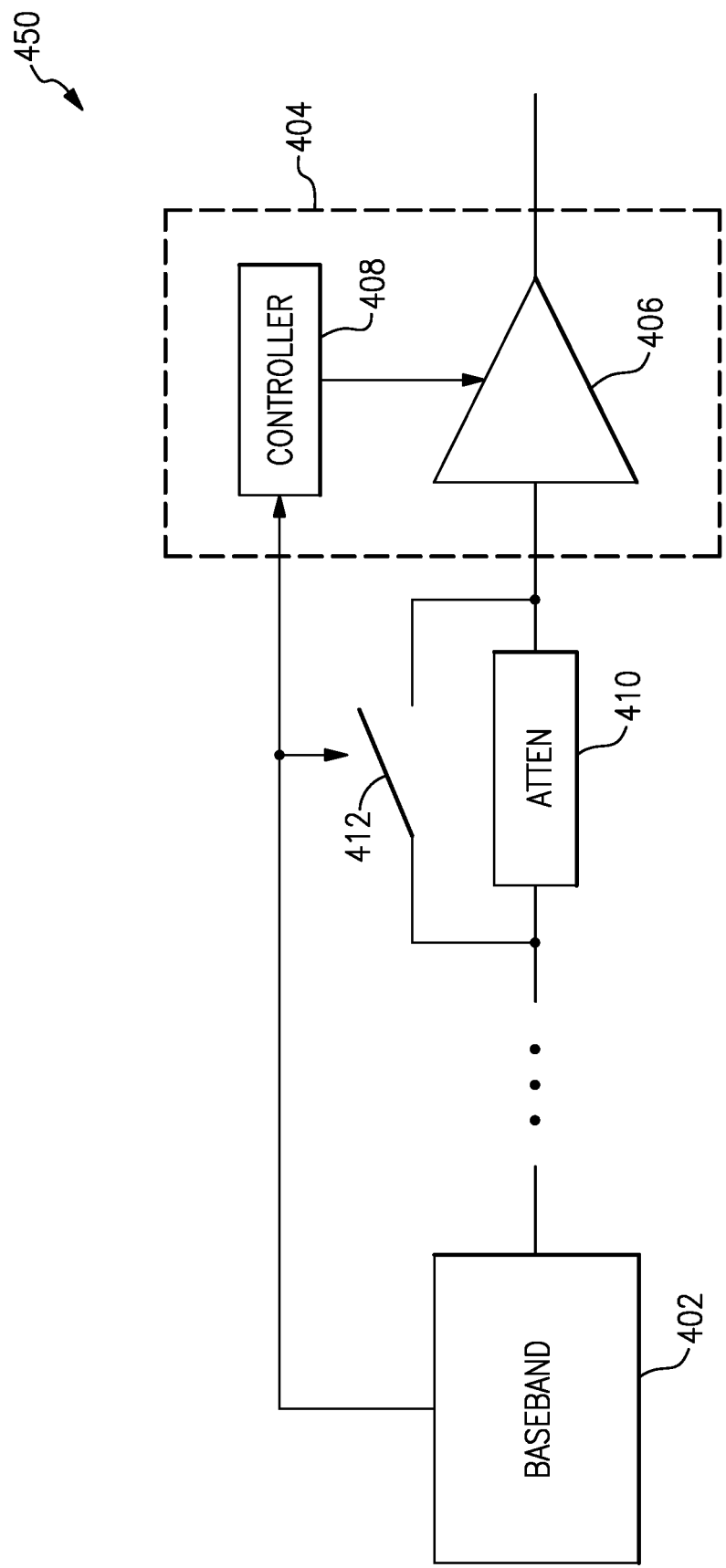
FIG. 4B is a schematic diagram of a power amplifier arrangement in accordance with one embodiment.

For example, FIG. 4B illustrates one embodiment of a power amplifier arrangement 450 in accordance with aspects described herein. In one example, the power amplifier arrangement 450 is substantially the same as the power amplifier arrangement 400 of FIG. 4A, except the power amplifier arrangement 400 includes an attenuator 410 coupled to the input of the power amplifier 404. In some examples, the power amplifier arrangement 450 may also include a bypass switch 412 coupled in parallel with the attenuator 410. The baseband processor 402 may provide an indication of the peak voltage for the upcoming symbol and/or a supply voltage value corresponding to the upcoming symbol to the controller 408. Based on the information provided from the baseband processor 402, the controller 408 may adjust the supply voltage accordingly (e.g., by controlling power supply circuitry). As described above, adjusting the supply voltage provided to the power amplifier 404 may alter the amplifier gain slightly. In one example, the attenuator 410 may be a variable attenuator, and the baseband processor 402 or the controller 408 may control the attenuator 410 to adjust the amplitude of the transmit signal to compensate for any minor gain variations. The bypass switch 412 may be used to bypass the attenuator 410. For example, when no amplitude adjustment is needed, the bypass switch 412 may be turned on (i.e., closed) such that the transmit signal bypasses the attenuator 410.

As described above, minor gain variations associated with modulating the supply voltage may be compensated for by adjusting amplitude out of the baseband processor 402 and/or adjusting an attenuator coupled to the input of the power amplifier 404. However, in some examples, modulating the supply voltage may lead to gain variations large enough to degrade EVM performance by an unacceptable amount. For example, a larger peak symbol power range may correspond to modulation of the supply voltage over a larger voltage range, leading to larger gain variations. As such, the look-up table stored in the baseband processor 402 and/or the controller 408 may include bias settings for the power amplifier 404 relative to supply voltage. For example, when a supply voltage adjustment causes the gain to increase, the bias level of the power amplifier 404 may be reduced to maintain a substantially constant gain across the entire supply voltage modulation range. Likewise, when a supply voltage adjustment causes the gain to decrease, the bias level of the power amplifier 404 may be increased to maintain the constant gain.

In another example, detector circuitry may be coupled to the output of the power amplifier 404. In some examples, the detector circuitry may be configured to detect the amplitude of the amplified transmit signal at specific frequencies (i.e., sub-carriers). In one example, the detector circuitry may detect the amplitude of one or more pilot tones embedded in the transmit signal (e.g., pilot tones 204 of FIG. 2A). As described above, the pilot tones are expected to have a fixed amplitude for all symbols, and as such, the detected pilot tone amplitude(s) may be used as reference points for gain correction. The controller 408 may receive the detected amplitude(s) and adjust to the bias level of the power amplifier 404 based on any gain variations detected.

In some examples, to control the bias level of the power amplifier 404, the controller 408 may adjust bias circuitry configured to provide a bias current to the one or more amplifier gain stages 406. The controller 408 may adjust the bias circuitry such that the bias current provided to each respective amplifier gain stage corresponds to the bias levels for the supply voltage. In some examples, each gain stage of the one or more amplifier gain stages 406 may have a dedicated bias supply and the controller 408 may adjust each dedicated bias supply such that each gain stage is biased to the appropriate bias level. In other examples, the controller 408 may include a current digital to analog converter (IDAC). The IDAC of the controller 408 may provide a reference current for each gain stage corresponding to the selected bias level(s). In some examples, the reference currents may be provided to each respective gain stage for biasing; however, in other examples the reference currents may be provided to one or more current mirrors, and the mirrored currents may be provided to each respective gain stage for biasing.

In some examples, the performance of the power amplifier 404 may vary with temperature. As such, the look-up table(s) stored in the baseband processor 402 and/or the controller 408 may have data corresponding to multiple temperature ranges. In one example, the baseband processor 402 and/or controller 408 may include a plurality of memory locations corresponding to the different temperature ranges. For example, a first memory location may be assigned to a first temperature range and a second memory location may be assigned to a second temperature range. Each memory location may contain a look-up table corresponding to the assigned temperature range. In one example, the baseband processor 402 and/or the controller 408 may collect or receive the temperature inside of the power amplifier 404, the temperature outside of the power amplifier 404, or the temperatures of individual components (e.g., the attenuator 410, etc.).

In one example, the baseband processor 402 and/or the controller 408 may adjust or calibrate the look-up table(s) based on various parameters during operation (e.g., temperature, output power, etc.). For example, over the duration of a burst, the power amplifier 404 may heat up and the efficiency of the amplifier may decrease (i.e., amplitude droop). In some examples, by monitoring the temperature of the power amplifier 404 and/or the baseband processor 402, the controller 408 may detect a decrease in amplifier efficiency and adjust the bias levels included in the look-up table(s) such that the gain of the power amplifier 404 remains substantially constant over the duration of the burst. In other examples, the baseband processor 402 and/or the controller 408 may monitor the output power of the power amplifier to detect changes in amplifier efficiency.

In some examples, the baseband processor 402 and/or the controller 408 may include different look-up tables for specific power amplifier configurations. For example, returning to FIG. 1, a first instance of the power amplifier 404 may be included in the signal conditioning stage 104 and a second instance of the power amplifier 404 may be included in the signal conditioning stage 108. In one example, the baseband processor 402 and/or the controller 408 may be configured to select a first look-up table from a first memory location for the first instance of the power amplifier 404 and a second look-up table from a second memory location for the second instance of the power amplifier 404.

Figure 5:
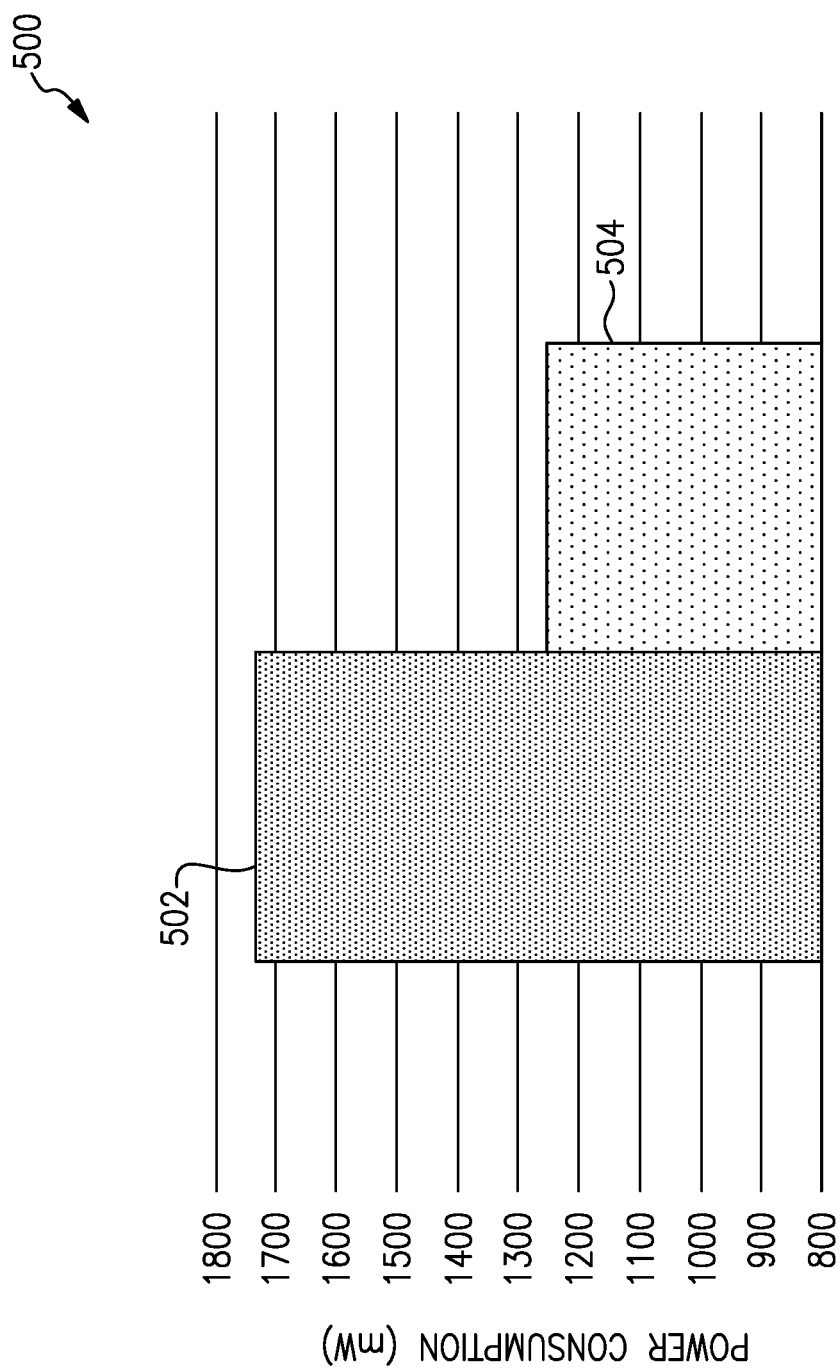
FIG. 5 is a graph illustrating simulated power consumption for examples of power amplifier arrangements in accordance with one embodiment.

FIG. 5 illustrates simulated power consumption of power amplifier arrangements. In one example, the graph 500 includes performance results for a first power amplifier arrangement including a power amplifier operated with a constant supply voltage and second power amplifier arrangement including a power amplifier operating with a modulated supply voltage as described herein (e.g., 400, 450). The first bar 502 represents the power consumption of the first power amplifier arrangement (i.e., constant supply voltage) and the second bar 504 represents the power consumption of the second power amplifier arrangement 504 (i.e., modulated supply voltage). As shown, the second power amplifier arrangement may experience a 30% reduction in power consumption over the duration of a burst.

Embodiments of the power amplifier arrangements 400, 450 as described herein can be implemented in a variety of different modules including, for example, a stand-alone amplifier module, a front-end module, a module combining the power amplifier 404 with an antenna switching network, or the like.

Modules may include a substrate and may include various dies and may include packaging, such as, for example, an overmold to provide protection and facilitate easier handling. An overmold may be formed over a substrate and dimensioned to substantially encapsulate the various dies and components thereon. The module may further include connectivity from the power amplifier 404 to the exterior of the packaging to provide signal interconnections, such as an input port connection, output port connection, control input connections, etc. Certain examples may have multiple connections to accommodate access to various individual components in the module. The various connections may be provided in part by wire bonds or solder bumps, for example, and may include multiple electrical connections where appropriate.

Embodiments of the power amplifier arrangements disclosed herein, optionally packaged into a module, may be advantageously used in a variety of electronic devices. General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. A power amplifier arrangement in accord with aspects and embodiments disclosed herein may be implemented within, among, or across any of the layers of the various structures, e.g., circuit board, substrates, and dies, as part of an electronic device, such as a cell phone, tablet, laptop computer, smart device, router, cable modem, wireless access point, etc.

Figure 6:
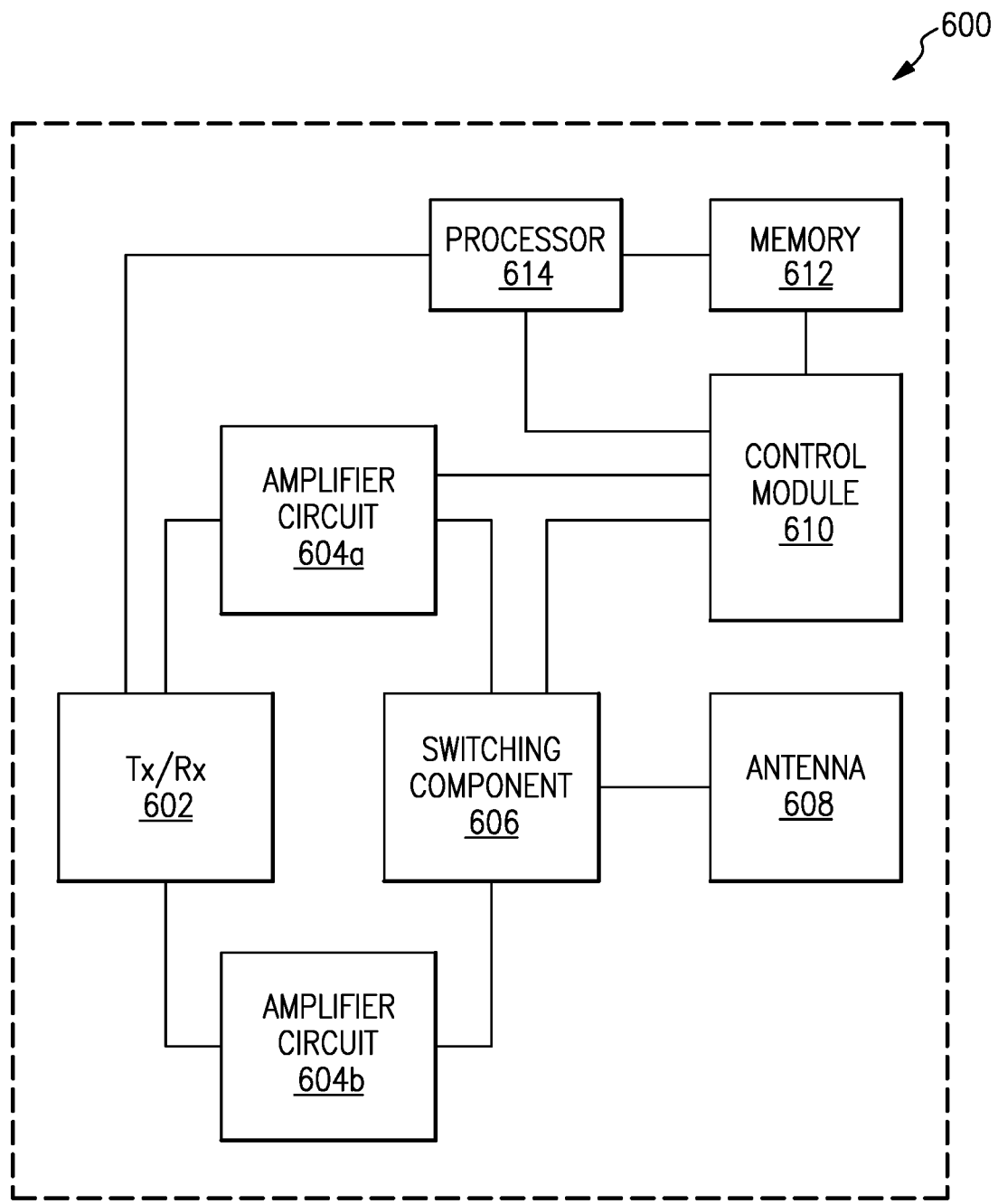
FIG. 6 is a block diagram of a wireless communication device in accordance with one embodiment.

For example, FIG. 6 is block diagram of a wireless communications device 600. The wireless device 600 can be a mobile device, such as a cellular telephone, a smart phone, a laptop computer, a tablet, etc. By way of example, the wireless device 600 can communicate in accordance with multiple communication standards including WiFi. In this example, the wireless device 600 can be configured to operate at one or more frequency bands defined by the WiFi standards. The wireless device 600 can alternatively or additionally be configured to communicate in accordance with one or more other communication standards, including but not limited to one or more of a 3G standard, a 4G standard, or a Long Term Evolution (LTE) standard.

As illustrated in FIG. 6, the wireless device 600 can include a transceiver 602, a first amplifier circuit 604a, a second amplifier circuit 604b, a switching component 606, at least one antenna 608, a control component 610, a memory component 612, and at least one processor 614. The first amplifier circuit 604a is configured to provide amplification of a radio-frequency signal to be transmitted via the at least one antenna 608, and the second amplifier circuit 604b is configured to provide amplification of a radio-frequency signal received via the at least one antenna 608. In one example, the first amplifier circuit 604a may include the power amplifier 404. In some examples, the first amplifier circuit 604a may include the attenuator 401 and the bypass switch 412. In certain examples, the first amplifier circuit 604a may also include other circuitry, such as impedance matching networks. Likewise, the functionality of the baseband processor 402 may be carried out by the transceiver 602, the control module 610, and/or the at least one processor 614.

As described, systems and methods directed to a power amplifier configured to receive a modulated supply voltage are provided herein. In at least one embodiment, the supply voltage provided to the power amplifier is modulated in accordance with the peak power of each symbol being amplified. In at least one embodiment, the supply voltage is modulated to reduce excess power consumption of the power amplifier while maintaining a substantially constant gain.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A power amplifier module comprising:
an input configured to receive an input radio-frequency signal, the input radio-frequency signal including a series of data symbols, the series of data symbols including a plurality of pilot tones;
an output configured to provide an output radio-frequency signal;
a power amplifier having a signal input to receive the input radio-frequency signal and a power supply input to receive a supply voltage, the power amplifier configured to amplify the input radio-frequency signal to provide the output radio-frequency signal; and
a controller to receive an indication of a peak output power level of an upcoming data symbol in the series of data symbols, to adjust at least the supply voltage provided to the power amplifier based on the peak output power level of the upcoming data symbol, and to configure the power amplifier module to maintain a substantially constant gain over the series of data symbols, wherein maintaining the substantially constant gain includes detecting a respective amplitude of each pilot tone of the plurality of pilot tones and correcting a gain of the power amplifier responsive to detecting a gain variation between at least two pilot tones of the plurality of pilot tones.

2. The power amplifier module of claim 1 wherein the controller is configured to adjust the supply voltage provided to the power amplifier by setting the supply voltage to a minimum supply voltage needed to achieve the peak output power level of the upcoming data symbol.

3. The power amplifier module of claim 2 wherein the controller is configured to adjust the supply voltage provided to the power amplifier by controlling power supply circuitry coupled to the power amplifier.

4. The power amplifier module of claim 1 wherein the controller is configured to receive the indication of the peak output power level of the upcoming data symbol from a baseband processor configured to generate the series of data symbols.

5. The power amplifier module of claim 1 wherein the controller includes a memory device configured to store a look-up table used to adjust the supply voltage provided to the power amplifier.

6. The power amplifier module of claim 1 wherein configuring the power amplifier module to maintain a substantially constant gain includes adjusting a bias current provided to the power amplifier.

7. The power amplifier module of claim 6 wherein the controller is configured to adjust the bias current provided to the power amplifier by controlling bias circuitry coupled to the power amplifier.

8. The power amplifier module of claim 6 wherein the controller is configured to adjust the bias current provided to the power amplifier by adjusting a reference current provided by the controller.

9. The power amplifier module of claim 6 wherein the bias current is adjusted such that a gain of the power amplifier varies by less than 0.05 dB over the series of data symbols.

10. The power amplifier module of claim 1 wherein configuring the power amplifier module to maintain a substantially constant gain includes adjusting an amplitude of the input radio-frequency signal provided to the power amplifier.

11. The power amplifier module of claim 10 further comprising an adjustable attenuator coupled to the input, the controller being configured to control the adjustable attenuator to adjust the amplitude of the input radio-frequency signal provided to the power amplifier.

12. The power amplifier module of claim 1 wherein the power amplifier module is configured to maintain a substantially constant gain over the series of data symbols such that the output radio-frequency signal is provided with a desired Error Vector Magnitude (EVM).

13. The power amplifier module of claim 1 wherein the power amplifier module is included in a WiFi system using an orthogonal frequency-division multiplexing (OFDM) scheme and the series of data symbols of the input radio-frequency signal correspond to at least one WiFi burst.

14. A method of operating a power amplifier module, the method comprising:
receiving an input radio-frequency signal at an input of a power amplifier, the input radio-frequency signal including a series of data symbols, the series of data symbols including a plurality of pilot tones;
receiving an indication of a peak output power level of an upcoming data symbol in the series of data symbols;
amplifying the input radio-frequency signal to provide an output radio-frequency signal at an output of the power amplifier;
adjusting at least a supply voltage provided to the power amplifier based on the peak output power level of the upcoming data symbol; and
configuring the power amplifier module to maintain a substantially constant gain over the series of data symbols, wherein maintaining the substantially constant gain includes detecting a respective amplitude of each pilot tone of the plurality of pilot tones and correcting a gain of the power amplifier responsive to detecting a gain variation between at least two pilot tones of the plurality of pilot tones.

15. The method of claim 14 wherein adjusting the supply voltage provided to the power amplifier based on the peak output power level of the upcoming data symbol includes setting the supply voltage to a minimum supply voltage needed to achieve the peak output power level of the upcoming data symbol.

16. The method of claim 14 wherein configuring the power amplifier module to maintain a substantially constant gain includes adjusting a bias current provided to the power amplifier.

17. The method of claim 14 wherein configuring the power amplifier module to maintain a substantially constant gain includes adjusting an amplitude of the input radio-frequency signal provided to the power amplifier.

18. The method of claim 17 wherein adjusting the amplitude of the input radio-frequency signal provided to the power amplifier includes controlling an adjustable attenuator coupled to the input of the power amplifier.

19. The method of claim 14 wherein the indication of the peak output power level of the upcoming data symbol in the series of data is provided by a baseband processor configured to generate the series of data symbols.

20. The method of claim 14 wherein the power amplifier module is included in a WiFi system using an orthogonal frequency-division multiplexing (OFDM) scheme and the series of data symbols of the input radio-frequency signal correspond to at least one WiFi burst.

* * * * *

UNITED STATES PATENT AND TRADEMARK OFFICE
CERTIFICATE OF CORRECTION

PATENT NO. : 11,683,016 B2
APPLICATION NO. : 17/141312
DATED : June 20, 2023
INVENTOR(S) : Grant Darcy Poulin Page 1 of 1

It is certified that error appears in the above-identified patent and that said Letters Patent is hereby corrected as shown below:

In the Specification

Column 5, Line 7, delete "Bus" and insert -- 8 us --

Signed and Sealed this
Eighteenth Day of July, 2023

Katherine Kelly Vidal
*Director of the United States Patent and Trademark Office*